United States Patent
Kim (10) Patent No.: US 7,403,420 B2
(45) Date of Patent: Jul. 22, 2008

(54) FLASH MEMORY DEVICE AND ASSOCIATED RECHARGE METHOD

(75) Inventor: Chan-ho Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 145 days.

(21) Appl. No.: 11/487,423

(22) Filed: Jul. 17, 2006

(65) Prior Publication Data

US 2007/0064512 A1 Mar. 22, 2007

(30) Foreign Application Priority Data

Sep. 21, 2005 (KR) .................. 10-2005-0087635

(51) Int. Cl.
*G11C 16/04* (2006.01)

(52) U.S. Cl. ..................... 365/185.18; 365/185.25; 365/226; 365/230.03

(58) Field of Classification Search ............ 365/185.17, 365/185.18, 185.25, 189.04, 189.09, 226, 365/230.03
See application file for complete search history.

(56) References Cited

U.S. PATENT DOCUMENTS

| 6,337,807 | B2* | 1/2002 | Futatsuyama et al. .. 365/185.17 |
| 6,731,540 | B2* | 5/2004 | Lee et al. ............... 365/185.17 |
| 2005/0002235 | A1 | 1/2005 | Kaneda |

FOREIGN PATENT DOCUMENTS

| JP | 2003-178590 | 6/2003 |
| KR | 100449269 | 9/2004 |

* cited by examiner

*Primary Examiner*—VanThu Nguyen
(74) *Attorney, Agent, or Firm*—Volentine & Whitt, PLLC (57) ABSTRACT

A flash memory device comprises first and second mat structures connected to respective first and second high voltage lines, and a switch circuit connected between the first and second high voltage lines. The switch circuit supplies a program voltage from the first high voltage line to the second high voltage line during a first program operation of the flash memory device, and then supplies a voltage from the second high voltage line to the first high voltage line during a second program operation.

18 Claims, 5 Drawing Sheets

FLASH MEMORY DEVICE AND ASSOCIATED RECHARGE METHOD

BACKGROUND OF THE INVENTION

1. Field of the Invention

Embodiments of the present invention relate generally to semiconductor memory devices. More particularly, embodiments of the invention relate to a flash memory device and an associated recharge method.

A claim of priority is made to Korean Patent Application No. 10-2005-0087635, filed on Sep. 21, 2005, the disclosure of which is hereby incorporated by reference in its entirety.

2. Description of Related Art

Flash memory is a popular form of non-volatile memory included in a wide variety consumer and industrial electronic devices such as cellular phones, personal computers, cameras, portable memory sticks, and personal digital assistants, to name but a few. Several aspects of flash memory make it a particularly attractive option for portable electronic devices. These aspects include its high degree of integration, high operating speed, low power consumption, and high resistance to physical shock. An example of a flash memory device is disclosed in Japanese Laid-open Patent Application No. 2003-178590.

A flash memory device typically comprises a plurality of memory cells divided into a plurality of memory blocks. The memory cells can be programmed or read in units of individual memory cells, bytes, or words, but the memory cells must be erased an entire memory block at a time.

Most flash memory devices can be broadly classified into one of two categories, depending on the arrangement of memory cells within the devices. The two categories include NAND-type flash memory devices, and NOR-type flash memory devices. In general, NAND-type flash memory devices have faster program and erase times, a lower cost per bit, and a higher degree of integration than NOR flash memory devices. On the other hand, NOR-type flash memories tend to have faster read times. As a result, NAND-type flash memories are generally preferred over NOR-type flash memories for use as mass data storage units.

The memory cells of a NAND-type flash memory device are organized in a plurality of strings, wherein each string comprises a plurality of memory cells connected in series between a source line and a bit line. Such a string of memory cells constitutes a memory block of the NAND-type flash memory device. Because the memory cells in each memory block of a NAND-type flash memory device are connected in series, the memory cells must be accessed sequentially.

NAND-type flash memories are commonly designed to have a memory mat (MAT) structure including a plurality of memory blocks. In general, a memory mat structure is an arrangement of memory components designed to emulate a variety of memory structures. A memory mat structure typically has a fixed access width corresponding to a word width of a system that includes the memory mat structure. In addition, a NAND-type flash memory device can aggregate several memory mats to provide a wider access width. For example, if the access width of a single memory mat is 8 bits, two memory mats can be aggregated to provide a 16 bit access width.

Figure 1:
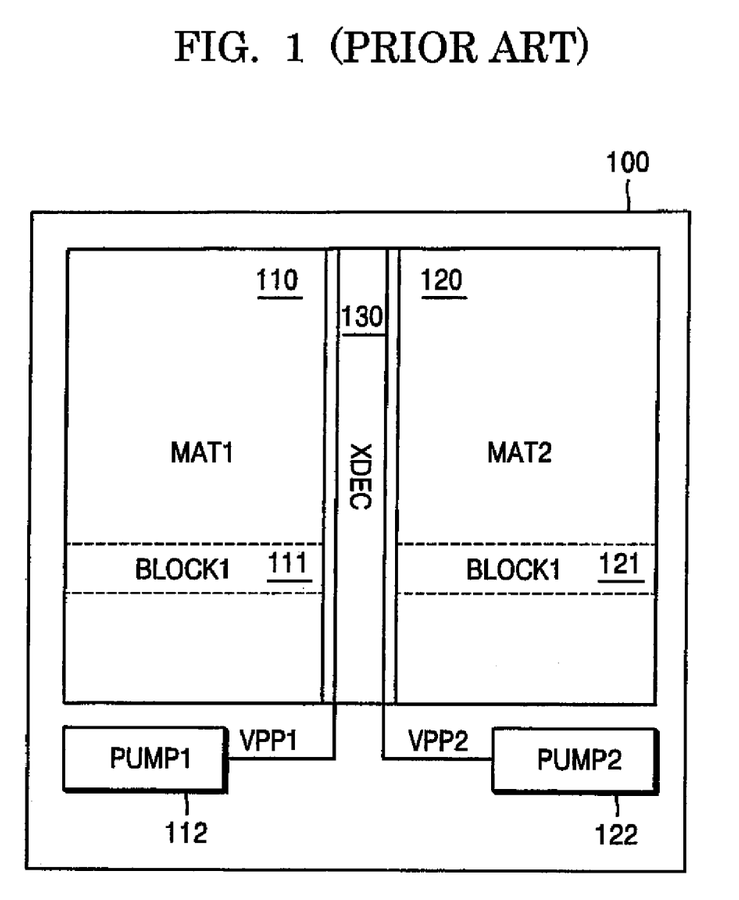
FIG. 1 is a schematic block diagram of a conventional flash memory device having a two MAT structure.

FIG. 1 is a schematic block diagram illustrating a flash memory device 100 including two memory mats. In other words, flash memory device 100 has a two-MAT structure.

Referring to FIG. 1, flash memory device 100 includes a first MAT 110 and a second MAT 120. A word line decoder 130 is disposed between first MAT 110 and second MAT 120, and memory blocks 111 and 121 are respectively arranged in first MAT 110 and second MAT 120.

A first pump circuit 112 and a second pump circuit 122 provide respective first and second high voltages VPP1 and VPP2 to first MAT 110 and second MAT 120 through word line decoder 130. The respective levels of first and second high voltages VPP1 and VPP2 can be either a program voltage Vpgm, an erase voltage Verase, a read voltage Vread, or a pass voltage Vpass, depending on an operating mode of flash memory device 100.

Figure 2:
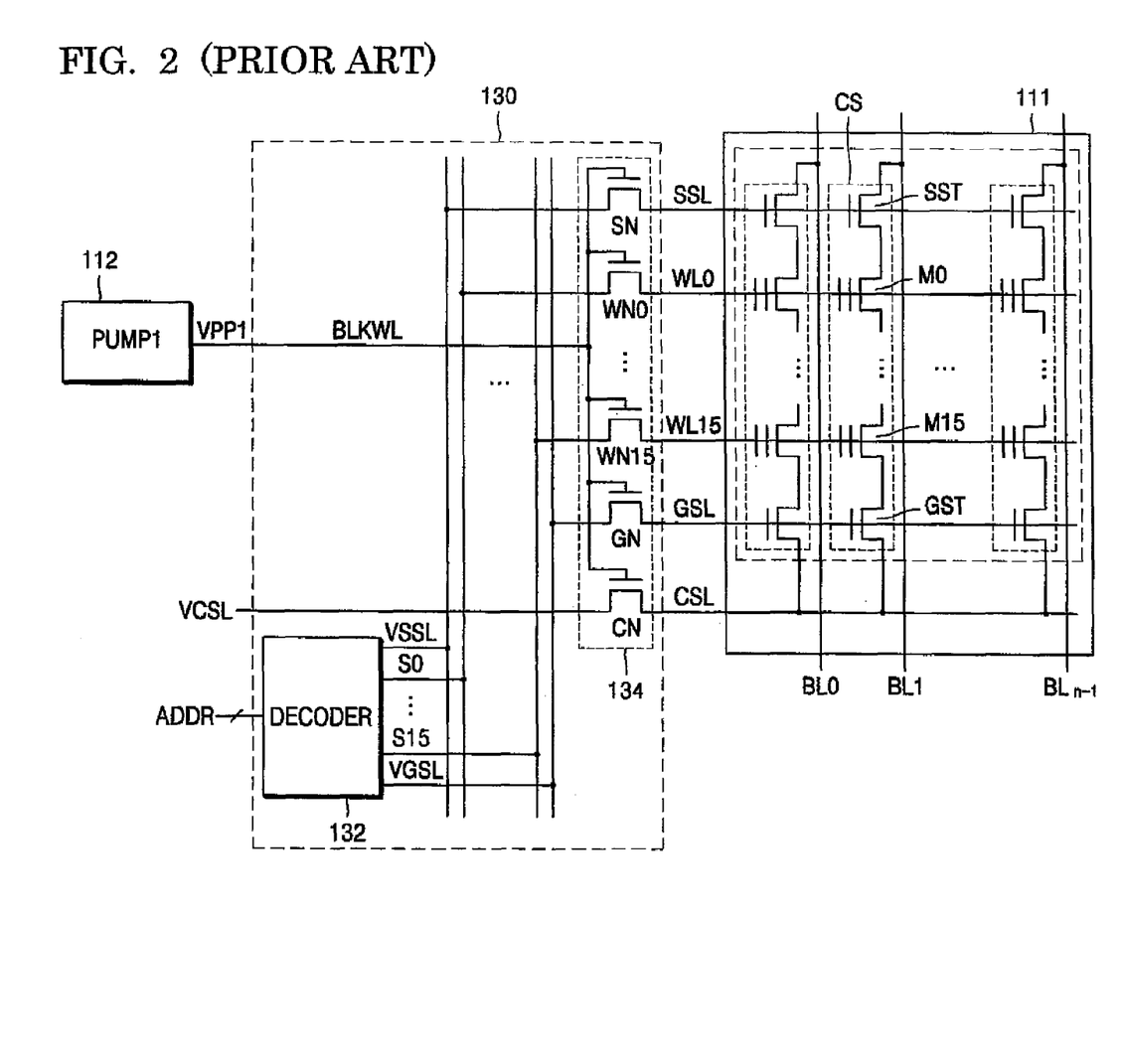
FIG. 2 is a circuit diagram of a first pump circuit and a word line decoder connected to a memory block in the flash memory device illustrated in FIG. 1.

FIG. 2 is a circuit diagram illustrating an example of first pump circuit 112, word line decoder 130, and memory block 111 shown in FIG. 1. Referring to FIG. 2, memory block 111 comprises "n" memory strings CS respectively connected to "n" bit lines BL0 through BLn−1. Each of memory strings CS comprises a string select transistor SST connected to a corresponding bitline, a plurality of memory cells M0 through M15, and a ground selection transistor GST. String select transistor SST, memory cells M0 through M15, and ground selection transistor GST are connected in series between the corresponding bitline and a common select line CSL.

The gates of memory cells M0 through M15 within each of memory strings CS are respectively connected to word lines WL0 through WL15. The gates of string selection transistors SST connecting memory strings CS to the respective bit lines BL0 through BLn−1 are connected to a string selection line SSL. The gates of ground selection transistors GST connecting memory strings CS to common source line CSL are connected to a ground selection line GSL.

Word line decoder 130 selectively activates string selection line SSL, ground selection line GSL, and word lines WL0 through WL15 of memory block 111. Word line decoder 130 comprises a decoder 132 receiving address signals ADDR and generating word line driving signals S0 through S15. Word line decoder further comprises a string selection voltage VSSL, a ground selection voltage VGSL, and a word line driver 134 for transferring word line driving signals S0 through S15, string selection voltage VSSL, and ground selection voltage VGSL to word lines WL0 through WL15, string selection line SSL, and ground selection line GSL.

Decoder 132 decodes address signals ADDR, and provides corresponding driving voltages to string selection line SSL, word lines WL0 through WL15, and ground selection line GSL. For example, decoder 132 provides program voltage Vpgm, erase voltage Verase, read voltage Vread, and pass voltage Vpass to string selection line SSL, word lines WL0 through WL15, and ground selection line GSL in a program operation, an erase operation, and a read operation, respectively.

Word line driver 134 includes high voltage pass transistors SN, WN0 through WN15, GN, and CN, for respectively applying string selection voltage VSSL, word line driving signals S0 through S15, ground selection voltage VGSL, and common source line voltage VCSL, to string selection line SSL, word lines WL0 through WL15, ground selection line GSL, and common source line CSL. First high voltage VPP1 output from first pump circuit 112 is applied to a block word line BLKWL in which gates of high voltage pass transistors SN, WN0 through WN15, GN, and CN are connected to each other.

First pump circuit 112 generates first high voltage VPP1 by a charge pumping operation when a pumping clock signal is applied. First high voltage VPP1 generated by first pump circuit 112 is provided to block word line BLKWL.

In the program operation, program voltage Vpgm is applied to an enabled word line, for example, to a first word line WL0, and pass voltage Vpass is applied to remaining word lines WL1 through WL15. In order to drive first word line WL0 using program voltage Vpgm provided by decoder 132, program voltage Vpgm is applied as a word line driving signal S0, and first high voltage VPP1 is applied to block word line BLKWL, so that pass transistor WN0 is turned on.

Program voltage Vpgm increases in proportion to the number of programmings and is generally between 15 V and 20 V. In order to transfer program voltage Vpgm without a voltage drop, first high voltage VPP1 is higher than program voltage Vpgm by a threshold voltage Vth of high voltage pass transistor WN0.

Figure 3:
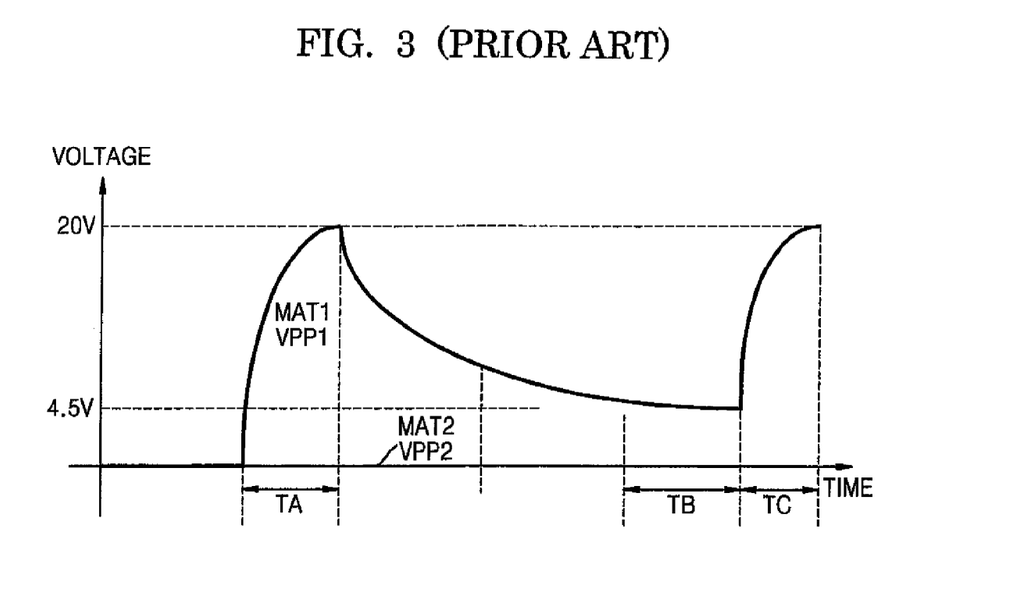
FIG. 3 is a graph plotting a first high voltage and a second high voltage during the operation of the flash memory device illustrated in FIG. 1.

FIG. 3 is a graph plotting first high voltage VPP1 and second high voltage VPP2 when flash memory device 100 operates.

Referring to FIG. 3, first high voltage VPP1 rises to 20V during an interval TA when a program operation is performed and falls to about 4.5 V during an interval TB when a read operation is performed. Thereafter, in an interval TC, when another program operation is performed, first pump circuit 112 performs a pumping operation to raise first high voltage VPP1 to about 20 V.

If the pumping operation is repeatedly performed, power consumption of flash memory device 100 increases. Furthermore, due to the repeated pumping operations, a noise characteristic of the flash memory device 100 deteriorates. Accordingly, the flash memory device 100 is not suitable to install in various devices such as mobile phones.

SUMMARY OF THE INVENTION

According to one embodiment of the invention, a flash memory device comprises a first high voltage line, a second high voltage line, and a switch circuit. The switch circuit is connected between the first and second high voltage lines and is adapted to supply a program voltage apparent at the first high voltage line to the second high voltage line during a first program operation, and then supply a voltage apparent at the second high voltage line to the first high voltage line during a second program operation.

According to another embodiment of the invention, a flash memory device having a 2-MAT structure comprising a plurality of block memory cell arrays is provided. The flash memory device comprises a pump circuit adapted to generate a program voltage, a first high voltage line connected between the pump circuit and a first MAT comprising a first plurality of memory blocks, a second high voltage line connected to a second MAT comprising a second plurality of memory blocks, a word line decoder connected to the first and second high voltage lines and adapted to drive the first and second pluralities of memory blocks with respective voltages apparent on the first and second high voltage lines, and a switch circuit connected between the first and second high voltage lines and adapted to supply the program voltage from the first high voltage line to the second high voltage line during a first program operation, and then apply a voltage apparent at the second high voltage line to the first high voltage line during a second program operation.

According to yet another embodiment of the invention, a method of recharging a flash memory device having a 2-MAT structure and comprising a plurality of memory blocks is provided. The method comprises generating a program voltage by operation of a pump circuit, and applying the program voltage to a first high voltage line connected to a first MAT to perform a first program operation. Upon completion of the first program operation, the program voltage is applied from the first high voltage line to a second high voltage line connected to a second MAT. The method further comprises applying a voltage apparent at the second high voltage line to the first high voltage line during a second program operation, and then, by operation of the pump circuit, applying the program voltage to the first high voltage line during the second program operation.

BRIEF DESCRIPTION OF THE DRAWINGS

The invention is described below in relation to several embodiments illustrated in the accompanying drawings. Throughout the drawings like reference numbers indicate like exemplary elements, components, or steps. In the drawings.

DESCRIPTION OF EXEMPLARY EMBODIMENTS

Exemplary embodiments of the invention are described below with reference to the corresponding drawings. These embodiments are presented as teaching examples. The actual scope of the invention is defined by the claims that follow.

Figure 4:
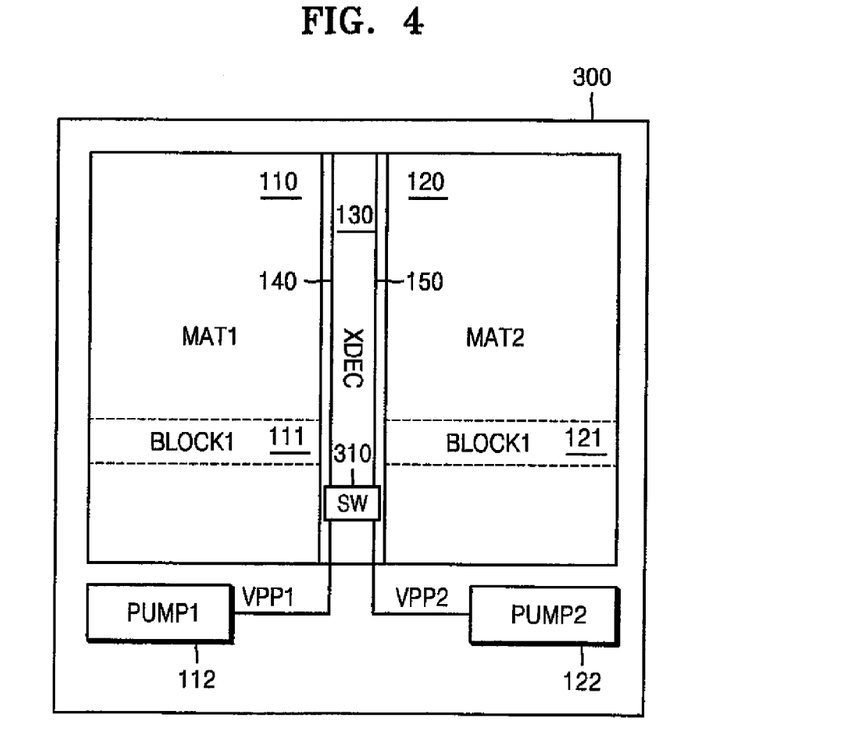
FIG. 4 is a block level diagram of a flash memory device according to an embodiment of the present invention.

FIG. 4 is a block level diagram of a flash memory device 300 according to an embodiment of the present invention.

Referring to FIG. 4, flash memory device 300 is similar to flash memory device 100, but further includes a switch circuit 310 connected between a first high voltage line 140 providing first high voltage VPP1, and a second high voltage line 150 providing second high voltage VPP1 in word line decoder 130. Switch circuit 310 selectively connects first high voltage line 140 with second high voltage line 150. The remaining components illustrated in FIG. 4 operate in the same manner as the corresponding components of flash memory device 100 illustrated in FIG. 1, and therefore detailed descriptions thereof are omitted to avoid redundancy.

Figure 5:
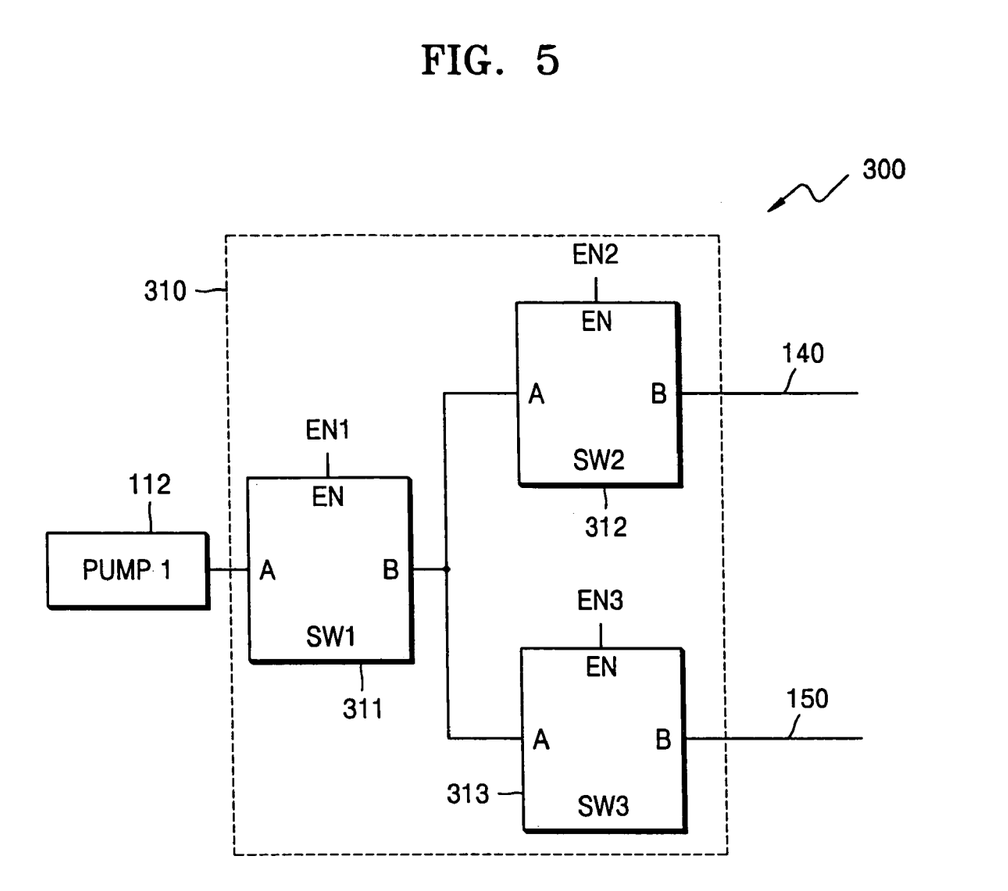
FIG. 5 is a circuit diagram of a switch circuit illustrated in FIG. 4 according to an embodiment of the present invention.

FIG. 5 is a circuit diagram of switch circuit 300 illustrated in FIG. 4 according to an embodiment of the present invention. Referring to FIG. 5, switch circuit 310 is connected between first pump circuit 112 and first and second high voltage lines 140 and 150. Switch circuit 310 can also be connected between second pump circuit 122 (not shown) and first and second high voltage lines 140 and 150. Switch circuit 310 includes first, second and third switches 311, 312 and 313.

First switch 311 is connected to first pump circuit 112 and is turned on in response to a first enable signal EN1. Second switch 312 is connected between first switch 311 and first high voltage line 140 and is turned on in response to a second enable signal EN2. Third switch 313 is connected between first switch 311 and second high voltage line 150 and is turned on in response to a third enable signal EN3.

Figure 6:
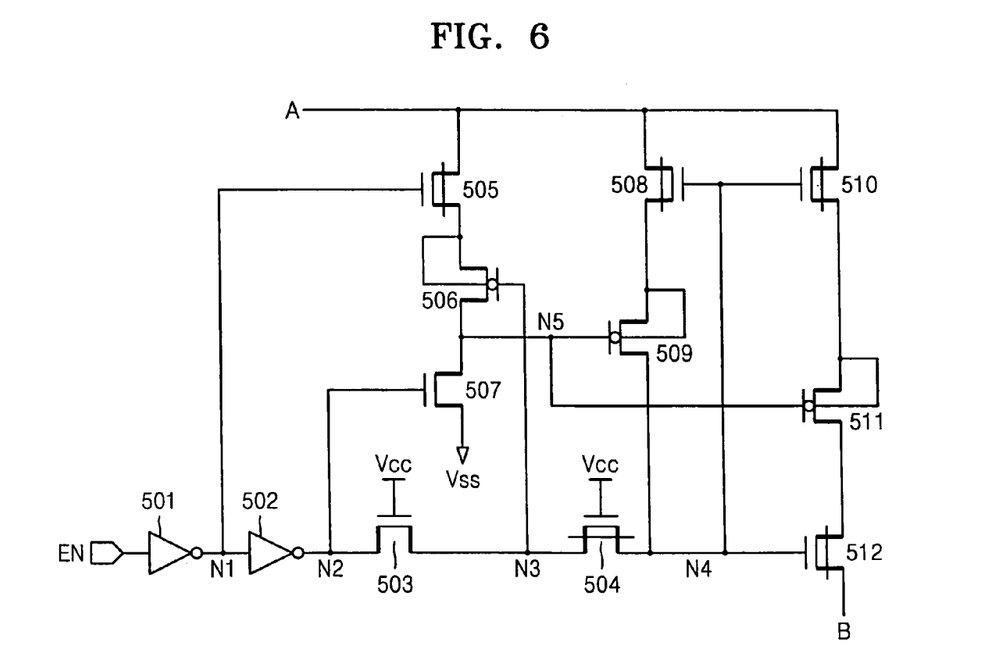
FIG. 6 is a circuit diagram showing an exemplary implementation of a switch that could be used for first, second and third switches illustrated in FIG. 5; and, FIG. 7 is a graph plotting a first high voltage and a second high voltage during the operation of the flash memory device illustrated in FIG. 5.

FIG. 6 is a circuit diagram illustrating an exemplary switch which can be used as first, second, and third switches 311, 312 and 313 in FIG. 5.

Referring to FIG. 6 the exemplary switch connects a first terminal "A" with a second terminal "B" in response to an enable signal EN. The switch comprises a first inverter 501 for receiving enable signal EN, a second inverter 502 connected to an output terminal N1 of first inverter 501, and first through tenth transistors 503 through 512.

First transistor 503 is an NMOS transistor whose source is connected to an output terminal N2 of second inverter 502 and whose gate is connected to a supply voltage Vcc.

Second transistor 504 is a depletion NMOS transistor whose source is connected to the drain of first transistor 503 and whose gate is connected to supply voltage Vcc.

Third transistor 505 is a depletion NMOS transistor whose source is connected to first terminal "A" and whose gate is connected to output terminal N1 of first inverter 501.

Fourth transistor 506 is a PMOS transistor whose source is connected to the drain of third transistor 505 and whose gate is connected to a drain N3 of first transistor 503.

Fifth transistor 507 is a NMOS transistor whose drain is connected to the drain of fourth transistor 506, whose gate is connected to output terminal N2 of second inverter 502, and whose source is connected to ground VSS.

Sixth transistor 508 is a depletion NMOS transistor whose source is connected to first terminal "A" and whose gate is connected to a drain N4 of second transistor 504.

Seventh transistor 509 is a PMOS transistor whose source is connected to the drain of the sixth transistor 508, whose gate is connected to a drain N5 of the fourth transistor 506, and whose drain is connected to drain N4 of second transistor 504.

Eighth transistor 510 is a depletion NMOS transistor whose source is connected to first terminal "A" and whose gate is connected to drain N4 of second transistor 504.

Ninth transistor 511 is a PMOS transistor whose source is connected to the drain of eighth transistor 510 and whose gate is connected to drain N5 of fourth transistor 506.

Tenth transistor 512 is a depletion NMOS transistor whose source is connected to the drain of ninth transistor 511, whose gate is connected to drain N4 of second transistor 504, and whose drain is connected to second terminal "B."

In first, second and third switches 311, 312 and 313, where enable signal EN goes "high", a signal apparent at output terminal N1 of first inverter 501 goes "low" and a signal apparent at output terminal N2 of second inverter 502 goes "high", so that fifth transistor 507 is turned on. Thus, a signal apparent at drain N5 of fifth transistor 507 goes "low" and ninth transistor 511 is turned on.

The signal apparent at output terminal N2 of second inverter 502, which is "high", is transferred to first and second transistors 503 and 504, so that a signal apparent at drain N4 of second transistor 504 goes "high". Eighth and tenth transistors 510 and 512 are turned on when the signal apparent at drain N4 of second transistor 504 goes "high". Accordingly, first terminal "A" is connected to second terminal "B" through eighth, ninth, and tenth transistors 510, 511 and 512. In other words, when enable signal EN is "high," a voltage apparent at first terminal "A" becomes equal to a voltage apparent at second terminal "B."

First terminal "A" of first switch 311 is connected to first pump circuit 112 and first high voltage VPP1 is applied to the first terminal "A" of switch 311. Accordingly, where an enable signal EN1 of first switch 311 is "high," second terminal "B" of first switch 311 receives first high voltage VPP1.

Meanwhile, where an enable signal EN1 of first switch 311 goes "low", a signal apparent at output terminal N1 of first inverter 501 goes "high" and a signal apparent at output terminal N2 of second inverter 502 goes "low", so that fifth transistor 507 is turned off. Thus, a signal apparent at drain N3 of the first transistor 503 goes "low" and fourth transistor 506 is turned on. High voltage VPP1 of first terminal "A" is transferred to third and fourth transistors 505 and 506 so that a signal apparent at drain N5 of the fourth transistor 506 goes "high". When the fifth transistor 507 goes "high", the ninth transistor 511 is turned off. Accordingly, the first terminal "A" is disconnected from second terminal "B."

Based on the operations of switches 311, 312 and 313, the operation of switching circuit 310 in flash memory device 300 of FIG. 5 will be described with reference to FIGS. 5, 6 and 7. In the following description it will be assumed that flash memory device 300 operates with a data access width of 8 bits, or X8. In other words, 8 bit data is input to or output from first MAT 110 shown in FIG. 4.

Figure 7:
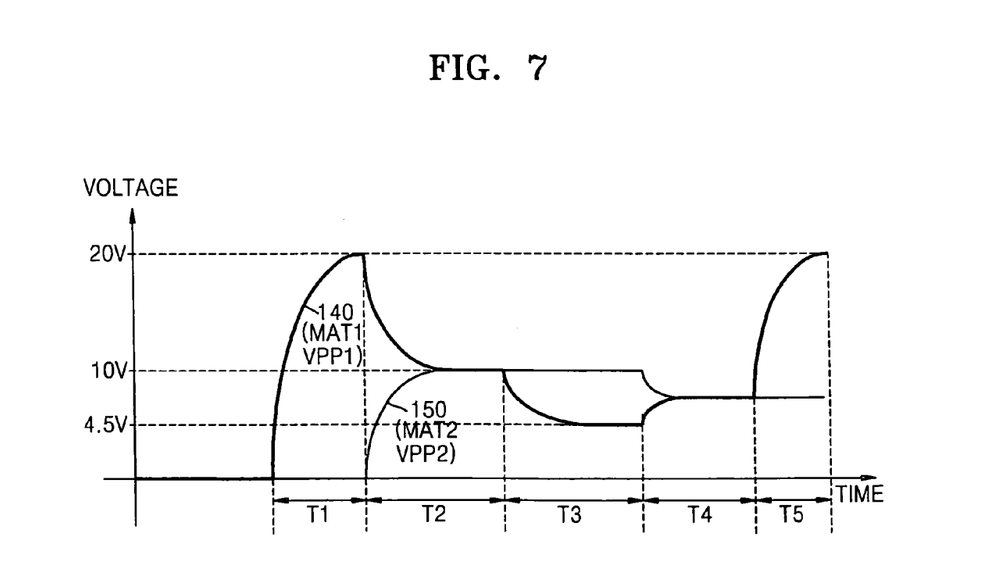

FIG. 7 is a graph plotting first high voltage VPP1 and second high voltage VPP2 during the operation of flash memory device 300 of FIG. 5.

Referring to FIG. 7, in a first interval T1 in which a first program operation is performed, first pump circuit 112 generates a program voltage Vpgm up to 20 V, as first high voltage VPP1. First high voltage VPP1 is transferred to first high voltage line 140 through first and second switches 311 and 312 which are turned on when first enable signal EN1 and second enable signal EN2 are activated. First high voltage VPP1 is provided to word line decoder 130 and drives block word line BLKWL. Since second pump circuit 122 does not operate, second high voltage line 150 is maintained at 0V.

Next, in a second interval T2, first enable signal EN1 is disabled to turn off first switch 311 and second and third enable signals EN2 and EN3 are activated to turn on respective second and third switches 312 and 313.

Program voltage Vpgm apparent on first high voltage line 140 is transferred to second high voltage line 150 through second and third switches 312 313. Program voltage Vpgm of first high voltage line 140 is divided equally between first high voltage line 140 and second high voltage line 150. Accordingly, first and second high voltage lines 140 and 150 have a voltage of about 10 V corresponding to half of program voltage Vpgm.

Next, in a third interval T3 when a read operation is performed, first pump circuit 112 generates high voltage VPP1 with a read voltage Vread of about 4.5 V. First high voltage VPP1 with read voltage Vread is transferred to first high voltage line 140 through first and second switches 311 and 312, which are turned on when first enable signal EN1 and the second enable signal EN2 are activated. At this time, third switch 313 is turned off. Thus, second high voltage line 150 is maintained at a voltage corresponding to half of program voltage Vpgm.

Then, in a fourth interval T4, first enable signal EN1 is disabled to turn off first switch 311, and second and third enable signals EN2 and EN3 are activated to turn on respective second and third switches 312 and 313. Second high voltage VPP2 of second high voltage line 150 is transferred to the first high voltage line 140 through second and third switches 312 and 313. Thus, a voltage of first high voltage line 140 rises from read voltage Vread.

At this time, first pump circuit 112 generates first high voltage VPP1 with program voltage Vpgm using a smaller number of pumping operations than used in the first program operation performed during first interval T1. Because the number of pumping operations used in fourth interval T4 is smaller than the number of pumping operations performed in first interval T1, the overall noise generated by operation of flash memory 300 device is less than the amount generated by operation of flash memory device 100.

Next, in a fifth interval T5 in which a second program operation is performed, first high voltage VPP1 generated by pump circuit 112 with program voltage Vpgm is transferred to first high voltage line 140 through first and second switches 311 and 312, which are turned on in response to the activation of first and second enable signals EN1 and EN2. First high voltage VPP1 is provided to word line decoder 130 to drive block word line BLKWL.

Flash memory device 300 according to the present invention stores the charges of first high voltage VPP1 corresponding to the program voltage Vpgm provided to first MAT 110 during a previous program operation, in second high voltage line 150 connected to a second MAT 120 in a read operation and uses the charges of first high voltage VPP1 to generate a first high voltage VPP1 corresponding to a program voltage Vpgm in a subsequent program operation. Since first pump circuit 112 can reduce the number of pumping operations to generate the first high voltage VPP1, flash memory device 300 can reduce power consumption and minimize noise due to pumping operations.

Furthermore, first pump circuit 112 can be designed to have smaller pumping capacity in view of the decrease in the number of pumping operations. As a result, the chip size of flash memory device 300 can also be reduced.

The foregoing preferred embodiments are teaching examples. Those of ordinary skill in the art will understand that various changes in form and details may be made to the exemplary embodiments without departing from the scope of the present invention as defined by the following claims.

What is claimed is:

1. A flash memory device, comprising:
   a first high voltage line;
   a second high voltage line; and,
   a switch circuit connected between the first and second high voltage lines and adapted to apply a program voltage apparent at the first high voltage line to the second high voltage line during a first program operation, and then apply a voltage apparent at the second high voltage line to the first high voltage line during a second program operation.

2. The flash memory device of claim 1, further comprising:
   a pump circuit adapted to apply the program voltage to the first high voltage line and the second high voltage line.

3. The flash memory device of claim 2, wherein the switch circuit comprises:
   a first switch controlled by a first enable signal and connected between the pump circuit and the first and second high voltage lines;
   a second switch controlled by a second enable signal and connected between the first switch and the first high voltage line; and,
   a third switch controlled by a third enable signal and connected between the first switch and the second high voltage line.

4. The flash memory device of claim 3, wherein each of the first, second and third switches comprises:
   a first inverter receiving a corresponding enable signal and having an output;
   a second inverter connected between the output of the first inverter and having an output;
   a first transistor having a source connected to the output of the second inverter, a gate receiving a power supply voltage, and a drain;
   a second transistor having a source connected to the drain of the first transistor, a gate receiving the power supply voltage, and a source;
   a third transistor having a source connected to a first terminal, a gate connected to the output of the first inverter, and a drain;
   a fourth transistor having a source connected to the drain of the third transistor, a gate connected to the drain of the first transistor, and a drain;
   a fifth transistor having a drain connected to the drain of the fourth transistor, a gate connected to the output of the second inverter, and a source connected to ground;
   a sixth transistor having a source connected to the first terminal, a gate connected to the drain of the second transistor, and a drain;
   a seventh transistor having a source connected to the drain of the sixth transistor, a gate connected to the drain of the fourth transistor, and a drain connected to the drain of the second transistor;
   an eighth transistor having a source connected to the first terminal, and a gate connected to the drain of the second transistor, and a drain;
   a ninth transistor having a source connected to the drain of the eighth transistor, a gate connected to the drain of the fourth transistor, and a drain; and
   a tenth transistor having a source connected to the drain of the ninth transistor, a gate connected to the drain of the second transistor, and a drain connected to a second terminal.

5. The flash memory device of claim 4, wherein, in each of the first, second and third switches, the first transistor and the fifth transistor are NMOS transistors.

6. The flash memory device of claim 4, wherein, in each of the first, second and third switches, the second, third, sixth, eighth, and tenth transistors are depletion NMOS transistors.

7. The flash memory device of claim 4, wherein, in each of the first, second and third switches, the fourth, seventh, and ninth transistors are PMOS transistors.

8. A flash memory device having a 2-MAT structure comprising a plurality of block memory cell arrays, the flash memory device comprising:
   a pump circuit adapted to generate a program voltage;
   a first high voltage line connected between the pump circuit and a first MAT comprising a first plurality of memory blocks;
   a second high voltage line connected to a second MAT comprising a second plurality of memory blocks;
   a word line decoder connected to the first and second high voltage lines and adapted to drive the first and second pluralities of memory blocks with respective voltages apparent on the first and second high voltage lines; and,
   a switch circuit connected between the first and second high voltage lines and adapted to supply the program voltage from the first high voltage line to the second high voltage line during a first program operation, and then apply a voltage apparent at the second high voltage line to the first high voltage line during a second program operation.

9. The flash memory device of claim 8, wherein the first MAT or the second MAT selectively operates or the first MAT and the second MAT operate together, according to a data access width of the flash memory device.

10. The flash memory device of claim 8, wherein the pump circuit is adapted to generate and apply a read voltage to the first high voltage line and the second high voltage line.

11. The flash memory device of claim 8, wherein the switch circuit comprises:

a first switch controlled by a first enable signal and connected between the pump circuit and the first and second high voltage lines;

a second switch controlled by a second enable signal and connected between the first switch and the first high voltage line; and, a third switch controlled by a third enable signal and connected between the first switch and the second high voltage line.

12. The flash memory device of claim 11, wherein each of the first, second and third switches comprises:

a first inverter receiving a corresponding enable signal and having an output;

a second inverter connected between the output of the first inverter and having an output;

a first transistor having a source connected to the output of the second inverter, a gate receiving a power supply voltage, and a drain;

a second transistor having a source connected to the drain of the first transistor, a gate receiving the power supply voltage, and a source;

a third transistor having a source connected to a first terminal, a gate connected to the output of the first inverter, and a drain;

a fourth transistor having a source connected to the drain of the third transistor, a gate connected to the drain of the first transistor, and a drain;

a fifth transistor having a drain connected to the drain of the fourth transistor, a gate connected to the output of the second inverter, and a source connected to ground;

a sixth transistor having a source connected to the first terminal, a gate connected to the drain of the second transistor, and a drain;

a seventh transistor having a source connected to the drain of the sixth transistor, a gate connected to the drain of the fourth transistor, and a drain connected to the drain of the second transistor;

an eighth transistor having a source connected to the first terminal, and a gate connected to the drain of the second transistor, and a drain;

a ninth transistor having a source connected to the drain of the eighth transistor, a gate connected to the drain of the fourth transistor, and a drain; and a tenth transistor having a source connected to the drain of the ninth transistor, a gate connected to the drain of the second transistor, and a drain connected to a second terminal.

13. The flash memory device of claim 12, wherein, in each of the first, second and third switches, the first transistor and the fifth transistor are NMOS transistors.

14. The flash memory device of claim 12, wherein, in each of the first, second and third switches, the second, third, sixth, eighth, and tenth transistors are depletion NMOS transistors.

15. The flash memory device of claim 12, wherein, in each of the first, second and third switches, the fourth, seventh, and ninth transistors are PMOS transistors.

16. A method of recharging a flash memory device having a 2-MAT structure and comprising a plurality of memory blocks, the method comprising:

by operation of a pump circuit, generating a program voltage;

applying the program voltage to a first high voltage line connected to a first MAT to perform a first program operation;

upon completion of the first program operation, applying the program voltage from the first high voltage line to a second high voltage line connected to a second MAT;

applying a voltage apparent at the second high voltage line to the first high voltage line during a second program operation; and, by operation of the pump circuit, applying the program voltage to the first high voltage line during the second program operation.

17. The method of claim 16, wherein a switch circuit is connected between the pump circuit and the first and second high voltage lines.

18. The method of claim 17, wherein the switch circuit comprises:

a first switch controlled by a first enable signal and connected between the pump circuit and the first and second high voltage lines;

a second switch controlled by a second enable signal and connected between the first switch and the first high voltage line; and, a third switch controlled by a third enable signal and connected between the first switch and the second high voltage line.

* * * * *